United States Patent
Komori et al.

[11] Patent Number: 6,044,014
[45] Date of Patent: Mar. 28, 2000

[54] ELECTRONIC CONTROL UNIT AND METHOD FOR STORING REWRITE COUNT OF NONVOLATILE MEMORY

[75] Inventors: Hirokazu Komori, Okazaki; Haruhiko Kondo, Anjo, both of Japan

[73] Assignee: Denso Corporation, Kariya, Japan

[21] Appl. No.: 09/333,994

[22] Filed: Jun. 16, 1999

[30] Foreign Application Priority Data

Jul. 22, 1998 [JP] Japan .................................. 10-206461

[51] Int. Cl.⁷ ................................................. G11C 16/04
[52] U.S. Cl. .............................. 365/185.04; 365/185.11; 365/185.29; 365/218
[58] Field of Search ...................... 365/185.04, 185.11, 365/185.29, 185.33, 218

[56] References Cited

U.S. PATENT DOCUMENTS

| | | | |
|---|---|---|---|
| 5,828,977 | 10/1998 | Hayashi et al. | 701/115 |
| 5,920,501 | 7/1999 | Norman | 365/185.11 |
| 5,930,167 | 7/1999 | Lee et al. | 365/185.33 |
| 5,963,474 | 10/1999 | Uno et al. | 365/185.04 |

*Primary Examiner*—Trong Phan
*Attorney, Agent, or Firm*—Nixon & Vanderhye P.C.

[57] ABSTRACT

An electronic control unit includes a flash memory as a nonvolatile memory, which is capable of erasing its storage contents block by block, for storing control programs and data. An erasure processing is carried out for the storage content in each of the blocks identified by an erasure command received from an external device, and a rewrite processing is carried out to replace the erased content with a new content received from the external device. The number of the erasure processing is counted only once when the first one of the erasure commands is received for a plurality of blocks, as long as the control unit is held operative after its initial condition.

6 Claims, 5 Drawing Sheets

ELECTRONIC CONTROL UNIT AND METHOD FOR STORING REWRITE COUNT OF NONVOLATILE MEMORY

CROSS REFERENCE TO RELATED APPLICATION

This application relates to and incorporates herein by reference Japanese Patent Application No. 10-206461 filed on Jul. 22, 1998.

BACKGROUND OF THE INVENTION

1. Field of the Invention

The present invention relates to an electronic control unit and method, which executes on-board rewrite of control programs and control data used for regulating operations of predetermined mechanisms or objects to be controlled.

2. Description of Related Art

In an electronic control unit which is in practical use for controlling such objects as an engine and transmission of an automobile, there is provided a nonvolatile read-only memory (electrically rewritable ROM) that is electrically erasable and rewritable. The rewritable ROM is so designed that control programs and control data stored therein can be rewritten after the production of the electronic control unit.

In normal operation, this kind of electronic control unit controls an engine and other control objects according to control programs and control data stored in the electrically rewritable ROM thereof. When an external memory rewrite device is connected to the electronic control unit and a rewrite command is issued, the electronic control unit recognizes that a rewrite condition is met. Then, the electronic control unit performs transition to a rewrite mode, and in the rewrite mode, the contents of the electrically rewritable ROM are replaced with new contents (program and/or data) received from the memory rewrite device.

In the electronic control unit having the above on-board rewritable memory, it is rather easy to cope with a possible requirement that an operation sequence (control sequence) is to be altered due to any cause after placement on the market.

However, in the flash memory or EEPROM employed as an electrically rewritable ROM in the electronic control unit, a limitation is imposed on the allowable maximum number of times the contents stored therein may be rewritten (i.e., allowable maximum erase/rewrite count of the contents of the memory).

Therefore, in the above electronic control unit, a rewrite count of the contents stored in the electrically rewritable ROM (rewrite count of the electrically rewritable ROM or rewrite count) is retained in a count information storage region allocated in the electrically rewritable ROM so that the contents of the electrically rewritable ROM will not be rewritten repeatedly beyond an allowable maximum rewrite count guaranteed for the electrically rewritable ROM.

For this reason, it is proposed to count the number of rewrite of the rewritable ROM every time the storage contents in each storage block is erased and rewritten. This counting method necessarily increases above the actual number of rewrite of the rewritable ROM, because each rewrite of one block is counted. That is, if three blocks are rewritten at one time, the count of rewrite is increased by three.

If the number of rewrite of the rewritable memory is counted block by block, the capacity or storage locations for storing the counted number is increased.

SUMMARY OF THE INVENTION

It is therefore an object of the present invention to obviate the above disadvantages by limiting counting the number of rewrite operation to only one as long as an electronic control unit is held operative from its initial condition irrespective of the number of blocks which are subjected to rewrite operation.

According to the present invention, an electronic control unit executes a rewrite operation for each block identified by a command received externally from a memory rewrite device. When a plurality of commands are received for rewriting a plurality of blocks of a nonvolatile memory, the electronic control unit erases and rewrites the storage contents of the identified blocks. The electronic control unit counts as the count of rewrite of the flash memory only the first one of the erasure processing executed after its initial condition, as long as the electronic control circuit is held operatively continuously from the initial condition.

BRIEF DESCRIPTION OF THE DRAWINGS

The above and other objects, features and advantages of the present invention will become more apparent from the following detailed description with reference to the accompanying drawings. In the drawings.

DETAILED DESCRIPTION OF THE PREFERRED EMBODIMENT

The present invention will now be described in detail with reference to one preferred embodiment shown in the accompanying drawings.

Figure 1:
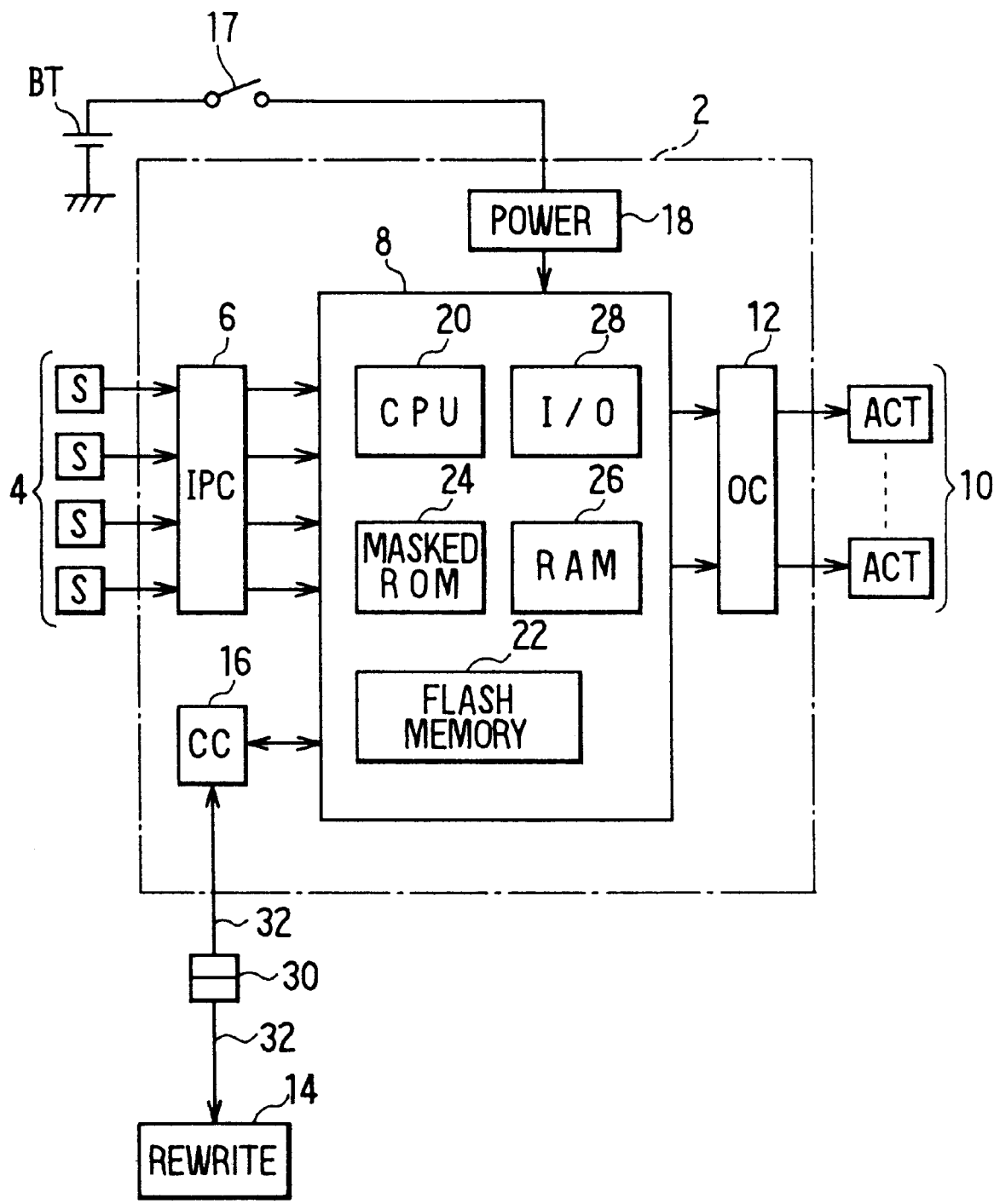
FIG. 1 is a block diagram showing a configuration of an electronic control unit (ECU) in one preferred embodiment of the present invention.

Referring to FIG. 1, there is shown a block diagram illustrating an electronic control unit (ECU) 2 mounted on a vehicle (automobile) for controlling an internal combustion engine in one preferred embodiment of the present invention.

As shown in FIG. 1, the ECU 2 comprises an input processing circuit 6 for performing waveform-shaping processing of input signals received from sensors 4 provided to detect operating conditions of the engine, a microcomputer 8 for carrying out various engine control processing operations according to sensor signals from the input processing circuit 6, an output circuit 12 for driving actuators 10 mounted on the engine such as a fuel injector and igniter according to control signals from the microcomputer 8, a communication circuit 16 for serial data communication with a memory rewrite device 14 to be connected as an external device, and a power supply circuit 18 for receiving power from a battery BT when an ignition switch 17 of the vehicle is turned on and supplying a power voltage (e.g., 5 V) for operating the microcomputer 8 and other circuits in the ECU 2.

The power supply circuit 18 is provided with a power-on-reset function, which is designed to output a reset signal to the microcomputer 8 for a predetermined time period to be taken until the power voltage becomes stable after the ignition switch 17 is turned on to start supplying the power voltage.

The microcomputer 8 comprises a known central processing unit (CPU) 20 which operates according to programs, a nonvolatile flash memory 22 and a masked ROM 24 for storing programs (more particularly, data constituting programs) necessary for operating the CPU 20 and data to be referenced in execution of programs, a volatile RAM 26 for temporarily storing results of calculations carried out by the CPU 20, an input/output (I/O) circuit 28 for communicating signals and data with the input processing circuit 6, output circuit 12 and communication circuit 16, and various register circuits (not shown).

The flash memory 22 is a read-only nonvolatile memory capable of electrically erasing and rewrite contents therein (electrically rewritable ROM). A program for controlling the engine (hereinafter referred to as an engine control program) and control data to be referenced for controlling the engine in execution of the engine control program are stored in the flash memory 22.

Figure 2:
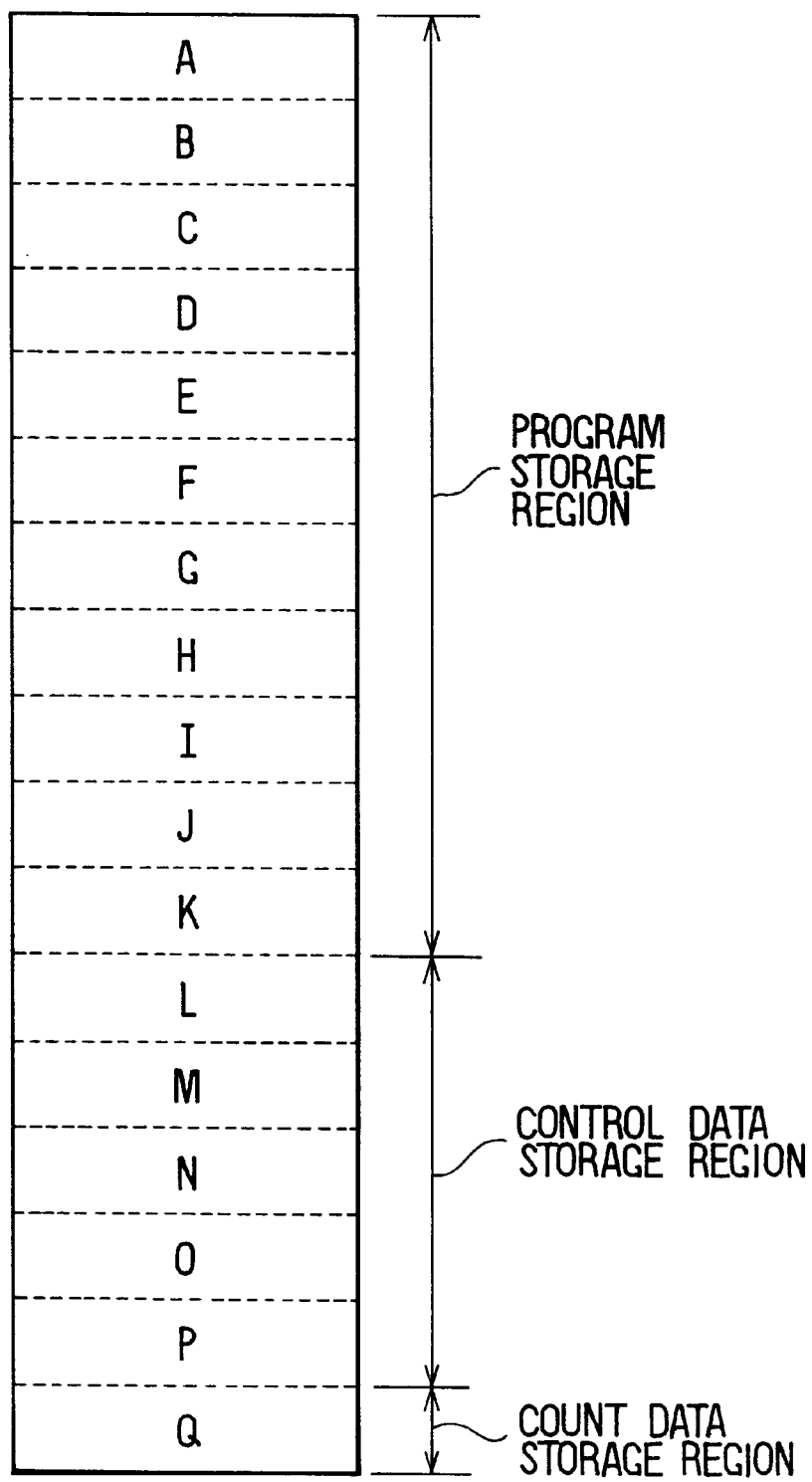
FIG. 2 is an explanatory diagram showing a storage region allocated in a flash memory used in the embodiment.

As shown in FIG. 2, the storage region (cell) of the flash memory 22 is divided into a plurality of blocks (seventeen blocks A–Q in the preferred embodiment), each of which has a predetermined number of bytes. The stored contents in the blocks A–Q are erasable block by block. In this embodiment, eleven blocks from the block A to the block K are used as program storage regions for storing the engine control program, and five blocks from the block L to the block P are used as control data storage regions for storing the control data of the engine control. Further, the block Q is used as a count data storage region for storing an erasure count value CT which is data indicating the number of data rewrites (i.e., erasure and writing of data) made to the flash memory 22.

The engine control program and the control data are written to the blocks A–P of the flash memory 22, after the microcomputer 8 is installed in the ECU 2 in the production process of the ECU 2. It is assumed here, however, that the engine control program and the control data have been written already.

In contrast, the masked ROM 24 is a read-only nonvolatile memory which does not permit rewrite the contents stored therein. A boot program to be executed immediately after the microcomputer 8 is reset for clearing is prestored in the masked ROM 24.

When the engine control program or control data contained in the flash memory 22 is replaced with a new program or new data, the memory rewrite device 14 is connected to the ECU 2. As shown in FIG. 1, the ECU 2 and the memory rewrite device 14 are interconnected via a connector 30 to provide a signal communication line 32 therebetween. With the connector 30 engaged, the microcomputer 8 in the ECU 2 can perform serial data communication with the memory rewrite device 14 through the communication circuit 16 and communication line 32.

In the ECU 2 arranged as described above, when the microcomputer 8 is reset for clearing and started from an initial state thereof, the boot program prestored in the masked ROM 24 is carried out first. Under normal operating condition that the memory rewrite device 14 is not connected, the boot program calls the engine control program contained in the flash memory 22 for carrying out an engine control processing procedure for controlling the engine.

If the microcomputer 8 determines that a rewrite condition (to be described later) is satisfied in execution of the boot program or in execution of the engine control processing, the microcomputer 8 receives a rewrite program from the memory rewrite device 14 and loads (transfers) the same into the RAM 26. Then, on the RAM 26, the rewrite program is run to carry out a rewrite processing procedure for replacing storage contents in the flash memory 22 with new contents (i.e., new engine control program and new control data) transmitted from the memory rewrite device 14.

Figure 3:
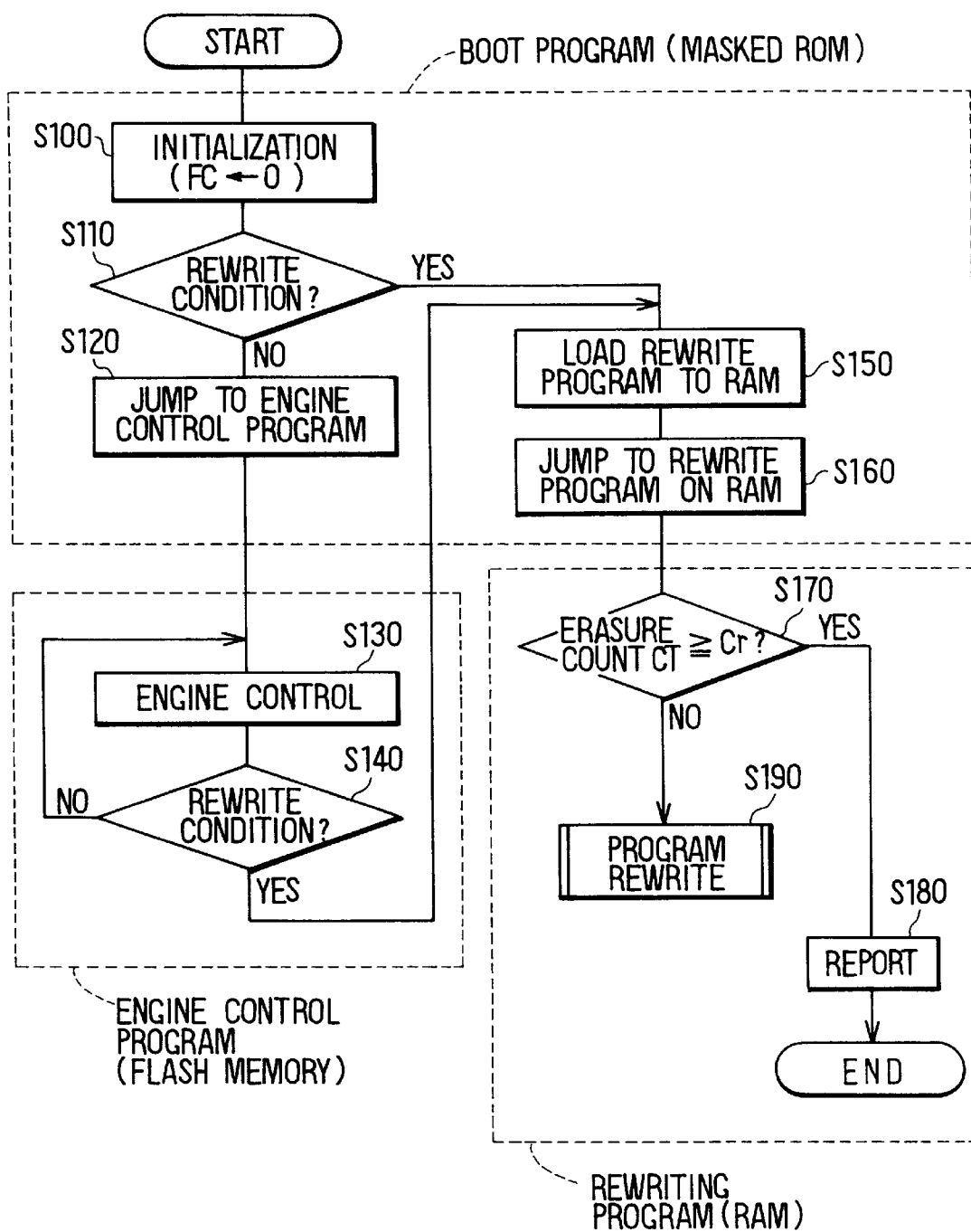
FIG. 3 is a general flow diagram showing an entire processing carried out in the ECU in the embodiment.
Figure 4:
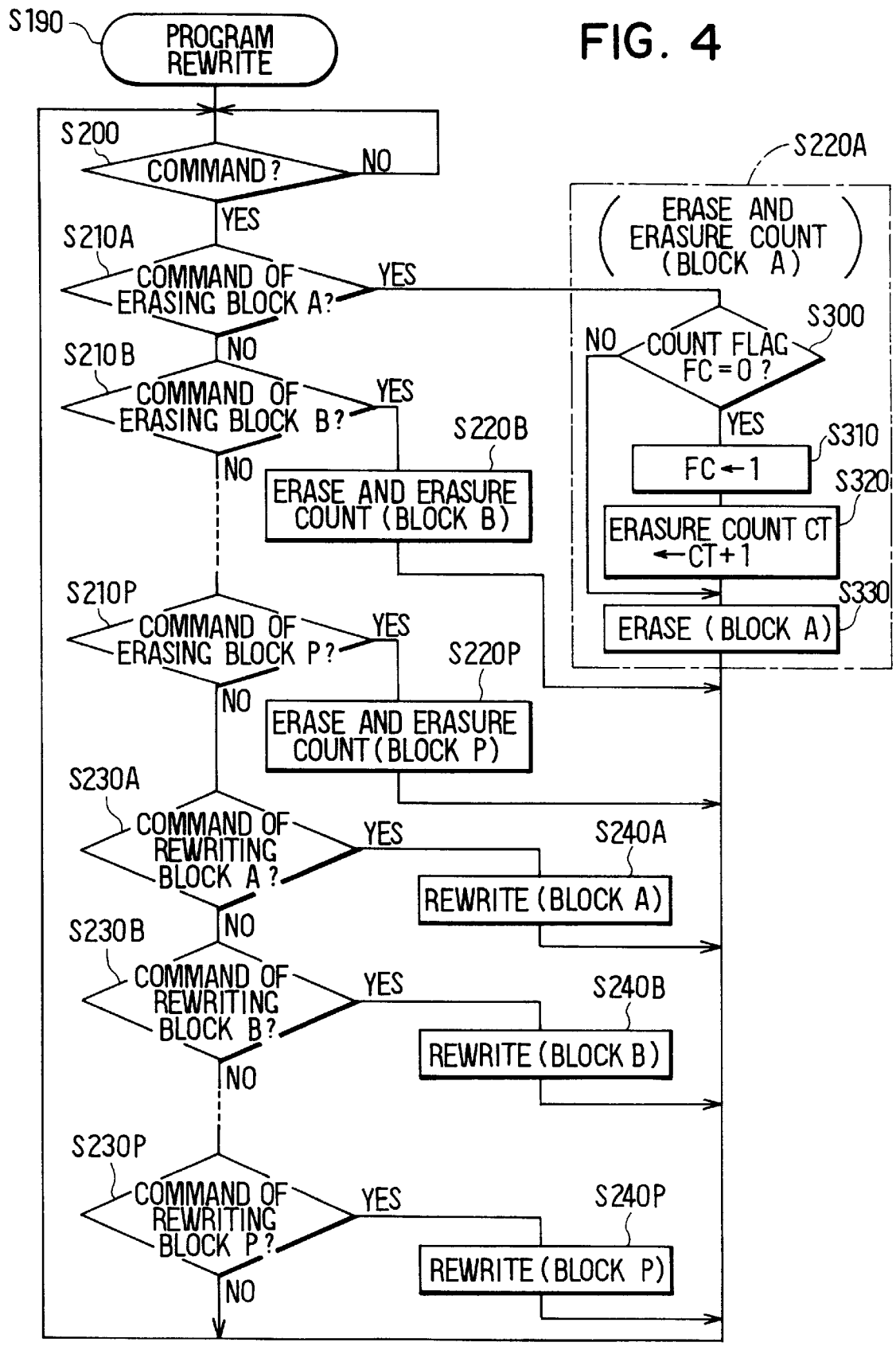
FIG. 4 is a flow diagram showing a program rewrite processing carried out in the ECU in the embodiment.

Then, the following describes processing procedures carried out by the microcomputer 8 in the ECU 2 with particular reference to the flow diagrams shown in FIGS. 3 and 4.

FIG. 3 is a general flow diagram showing the entire processing carried out by the microcomputer 8. Processing steps S100–S120, S150 and S160 are executed by the boot program prestored in the masked ROM 24. ("S" prefixed to a reference numeral stands for "step".) Processing steps S130 and S140 are executed by the engine control program contained in the flash memory 22, and processing steps S170 to S190 are executed by the rewrite program loaded from the memory rewrite device 14 to the RAM 16.

As shown in FIG. 3, when the ignition switch 17 is turned on, the microcomputer 8 starts its processing operation from the initial (reset) state to execute the boot program prestored in the masked ROM 24. First, at step S100, an initialization processing is carried out to initialize the RAM 26 and the internal registers (not shown). In this initialization processing, "0" is set as the initial value to a count completion flag FC of the RAM 26. This count completion flag FC indicates whether counting of the number of erasure processing, in which the storage contents of any one of the blocks of the flash memory 22 is erased, has been completed or not. "0" indicates that the number of execution of the erasure processing has not been counted yet.

Next, at step S110, it is determined whether a rewrite condition for replacing the contents stored in the flash memory 22 is satisfied or not. In the present preferred embodiment, it is determined that the rewrite condition is satisfied when a rewrite command indicating an instruction to rewrite the contents of the flash memory 22 is issued from the memory rewrite device 14 connected to the ECU 2 through the communication line 32 and the rewrite command is detected by the microcomputer 8 in reception interrupt processing or the like.

At step S110, if it is determined that the rewrite condition is not satisfied (S110: NO), a normal engine control mode is recognized to select step S120. Then, at step S120, a jump is made to the start address of the engine control program contained in the flash memory 22.

Thereafter, the engine control program contained in the flash memory 22 is called into execution to perform processing procedures of steps S130 and S140.

More specifically, at step S130, engine control processing is carried out to control the engine. In the engine control processing, an optimum fuel injection amount, ignition timing and other engine operating parameters are calculated according to various sensor signals received from the input processing circuit 6 and control data contained in the flash memory 22. Then, based on the results of calculation, control signals are delivered to the output circuit 12 for driving the actuators 10 including such devices as the fuel injector and igniter.

Since the engine control processing is carried out repeatedly, the engine is run continuously. Each time the engine control processing comes to an end, step S140 is taken before repetition of the engine control processing. At step S140, a determination is formed to check whether or not the rewrite condition is satisfied as in the case of step S110.

Then, if the rewrite condition is not satisfied (S140: NO), step S130 is taken again to repeat the engine control processing.

That is, each time the engine control processing (S130) is repeated, it is checked whether the rewrite condition is satisfied or not (S140). Unless the rewrite condition is satisfied, the engine control processing (S13) is continued repeatedly.

On the contrary, if it is determined that the rewrite condition is satisfied at step S110 of the boot program or at step S140 of the engine control program (S110: YES, or S140: YES), a rewrite mode for replacing the contents stored in the flash memory 22 is recognized to select step S150 of the boot program. At step S150, the rewrite program received from the memory rewrite device 14 is loaded or written into the RAM 26.

The memory rewrite device 14 is so designed as to issue the rewrite command and then send the rewrite program to the ECU 2 when a predetermined operation is performed on the memory rewrite device 14. Therefore, through processing at step S150, the microcomputer 8 in the ECU 2 receives the rewrite program from the memory rewrite device 14 and loads the same into the RAM 26.

Then, upon completion of loading the rewrite program into the RAM 26 at step S150, the next step S160 is taken to make a jump to the start address of the rewrite program loaded on the RAM 26.

The microcomputer 8 then executes the rewrite program on the RAM 26 to carry out processing procedures of steps S170 to S190.

More specifically, at step S170, the erasure count value CT indicative of the number of rewrite the flash memory 22 is read out from the block Q which is the count data storage area of the flash memory 22, and it is checked whether the erasure count value CT is equal to or more than a predetermined reference value Cr. Here, the predetermined reference value Cr is set to the same value as the number of guaranteed rewrite of the flash memory 22 (i.e., the number of guaranteed erasing and writing operations) or to a value slightly smaller than the number of rewrite guaranteed.

If it is determined at step S170 that the erasure count value CT is larger than the predetermined reference value Cr (S170: YES), the microcomputer 8 proceeds to step S180 and carry out a report processing and thereafter ends the entire processing. In the report processing of step S180, a report signal indicating that the number of rewrite the flash memory 22 has reached the number of guaranteed rewrite is transmitted. The memory rewrite device 14 displays on its display device a message indicting that the number of rewrite the flash memory 22 has reached the number of guaranteed rewrite and ends its communication with the ECU 2, when the memory rewrite device 14 receives the report signal sent out at step S180.

If it is determined that the erasure count value CT is less than the predetermined reference value Cr at step S170 (S170: NO), the microcomputer 8 determines that the rewrite of the flash memory 22 is still possible and proceeds to step S190 to carry out the program rewrite processing shown in FIG. 4.

Here, the memory rewrite device 14 is so constructed as to send out sequentially erasure commands as erasure requests to each block, which is to be rewritten this time, of the blocks A–P of the flash memory 22, after sending out the rewrite program to the ECU 2. The microcomputer 8 is so constructed also to send out sequentially writing commands to each block, which is to be rewritten this time, after sending out the erasure commands. The erasure command includes a command data for requesting an erasure of the storage content and an identification data for identifying the block (any one of blocks A–P), the storage content of which is to be erased this time. The writing command includes a command data for requesting a data writing, an identification data for identifying the block (any one of blocks A–P) into which the data is to be written, writing data for the block (i.e., new engine control program or new control data), and addresses for indicating locations to which the writing data is written.

As shown in FIG. 4, the microcomputer 8 of the ECU 2 starts execution of the program rewrite processing at step S190 and waits for a command (erasure command or writing command) from the memory rewrite device 14 at step S200.

If the command from the memory rewrite device 14 is received (S200: YES), the microcomputer 8 proceeds to step S210A to check whether the command received at step S200 is the erasure command for the block A (i.e., the erasure command including the identification data of the block A and the erasure command requesting erasure of storage content in the block A) or not. Then, if it is the erasure command for the block A (S210A: YES), the microcomputer 8 proceeds to step S220A to carry out a processing of erasure and updating of erasure count value. Thereafter, the microcomputer 8 returns to step S200 and waits for the next command from the memory rewrite device 14.

In the processing of erasure and updating of erasure count value, as shown by one-dot chain line in FIG. 4, it is checked at step S300 whether the count completion flag FC is "0". If the count completion flag FC is 0 (S300: YES), "1" is set in the count completion flag FC at step S310 to indicate that the number of execution of the erasure processing has been counted. At step S320, the erasure count value CT is read out from the block Q (count data storage region) of the flash memory 22, and a new count value CT (i.e., CT+1) is written into the block Q of the flash memory 22 after adding 1 to the erasure count value CT read out as above. At the subsequent step S330, the erasure processing is carried out to erase the storage content in the block A of the flash memory 22. On the contrary, if it is determined at step S300 that the count completion flag FC is not "0", i.e., FC=1, (S300: NO), the microcomputer 8 proceeds to step S330 without execution of steps S310 and S320 and carries out the erasure processing to erase the storage contents in the block A of the flash memory 22.

If it is determined at step S210A that the command received at step S200 is not the erasure command for the block A (S210A: NO), the microcomputer 8 proceeds to step S210B to check further whether the command received at step 200 is the erasure command for the block B. If it is the erasure command for the block B (S210B: YES), the microcomputer 8 proceeds to step S220B to carry out the erasure and erasure count value updating processing in the same manner as in step S220. The microcomputer 8, returning to step S200 thereafter, waits for the next command from the memory rewrite device 14. It is noted, however, at step S230 in the erasure and erasure count value updating processing of step S220B, the storage contents in the block B of the flash memory 22 is erased.

Although not shown in FIG. 4 with respect to the blocks C–O, if it is determined that the command received at step S200 is not the erasure command for the block B (S210B: NO), it is checked whether the command received at step S200 is the erasure command for any of the blocks C–O. If it is the erasure command for either one of the blocks C–O, the microcomputer 8 carries out the erasure and erasure count value updating processing in the same manner as in steps S320 and S330, and then returns to step S200. In the erasure and erasure count value updating processing at step S330, the storage contents of the block identified by the received erasure command are erased.

That is, in the part indicated by the dotted line between step S210B and step S210P in FIG. 4, there are provided in the same manner as steps S210A and S210B processing steps S210C–S210O for checking whether the received command is for requesting erasure of each of the blocks C–O, and in the same manner as steps 220A and 220B processing steps S220C–S220O, i.e., the erasure and erasure count value updating processing, for erasing the storage contents of the block identified by the received erasure command and updating the erasure count value CT when the determination at each step S210C–S210O is affirmative.

If the command received at step S200 is not a command for erasing the blocks A–O, it is checked whether the command received at step S200 is an erasure command of the block P. If it is the erasure command for the block P (S210P: YES), the erasure and erasure count value updating processing is carried out at step S220P in the same manner as in steps S220A and S220B. The microcomputer 8 then returns to step S200. At step S330 in the erasure and erasure count updating processing of step 220P, the storage contents in the block P of the flash memory 22 are erased.

On the contrary, if it is determined at step S210P that the command received at step S200 is not the erasure command for the block P (S210P: NO), the microcomputer 8 proceeds to step S230A because the command received this time at step S200 is considered to be not the erasure command but to be the writing command for either one of the blocks A–P.

It is checked at step S230A whether the command received at step S200 is the writing command (rewrite command) for the block A (i.e., writing command including the identification data of the block A and requesting the writing into the block A along with the data to be written into the block A). If it is the writing command for the block A (S230A: YES), the microcomputer 8 proceeds to step S240A to carry out a writing processing (rewrite processing), in which the writing data included in the received writing command for the block A is written into the block A of the flash memory 22. In this writing processing, a sum check is made on the written data. Then, the microcomputer 8 returns to step S200 to wait for the next command from the memory rewrite device 14.

If it is determined at step S230A that it the command received at step S200 in not the writing command for the block A (S230A: NO), the microcomputer 8 proceeds to step S230B to determine if the command received at the step S200 is the writing command is for the block B. If it is the writing command for the block B (S230B: YES), the microcomputer 8 proceeds to step S240B, to carry out the writing processing as in step S240A and returns to step S200 to wait for the next command from the memory rewrite device 114. In this writing processing at step S240B, the writing data included in the received writing command for the block B is written into the block B of the flash memory 22.

Although not shown in FIG. 4 with respect to the blocks C–O, if it is determined at step S230B that the command received at step S200 is not the writing command for the block B (S230B: NO), it is checked whether the command received at step S200 is the writing command for any of the blocks C–O in the same manner as in steps S230A and S230B. If it is the writing command for either one of the blocks C–O, the microcomputer 8 carries out the writing processing in the same manner as in steps S240A and S240B, and then returns to step S200. In this writing processing, the writing data included in the received writing command is written into the block identified by the received writing command.

That is, in the part indicated by the dotted line between step S230B and step S230P in FIG. 4, there are provided in the same manner as steps S230A and S230B processing steps S230C–S230O for checking whether the received command is for requesting writing of each of the blocks C–O, and in the same manner as steps 240A and 240B processing steps S240C–S240O, i.e., the writing processing, for writing the writing data included in the writing command into the block identified by the received writing command when the determination at each step S230C–S230O is affirmative.

If the command received at step S200 is not the writing command for the blocks A–O, it is checked at step 230P whether the command received at step S200 is the writing command for the block P. If it is the writing command for the block P (S230P: YES), the writing processing is carried out at step S240P in the same manner as in steps S240A and S240B. The microcomputer 8 then returns to step S200. At step S230 in the writing processing of step S240P, the writing data included in the writing command for the block P is written into the block P of the flash memory 22.

On the contrary, if it is determined that the command received at step S200 is not the writing command for the block P (S230P: NO), the microcomputer 8 returns to step S200 to wait for the next command from the memory rewrite device 14.

In the above preferred embodiment, when the storage contents of the flash memory 22 in the ECU 2 are to be replaced by rewrite operation, the memory rewrite device 14 is connected first to send out the writing command. Then, the microcomputer 8 in the ECU 2 makes an affirmative determination at step S110 or S140 in FIG. 3 and changes its operation mode to the rewrite mode to carry out the processing of steps S150–S190.

Next, the memory rewrite device 14 sends out the rewrite program to the ECU 2, and sends out sequentially the erasure command for any of the blocks A–P of the flash memory 22 the storage contents of which are to be replaced. The microcomputer 8 responsively carries out the processing of steps S210A, 220A–S210P and S220P in FIG. 4 to erase sequentially the storage contents of the blocks identified by each erasure command form the memory rewrite device 14.

Still further, the memory rewrite device 14 sends out sequentially the writing commands to the ECU 12 in the order of the blocks the storage contents of which are to be replaced. The microcomputer 8 responsively carries out the processing of steps S230A, S240A–S230P and 240P in FIG. 4 to write the writing data included in each writing command from the memory rewrite device 14 into the blocks the storage contents of which have been erased as above.

In the above preferred embodiment, the number of erasure carried out at step S330 in each of erasure and erasure count updating processing of steps S220A–S220P is counted and stored at step S320. This counting operation at step S320 is carried out, only when the ECU 2 starts its operation from its initial condition and carries out the erasure processing in response to the first command of erasure from the memory rewrite device 14.

That is, the ECU 2 according to the preferred embodiment, the electric power is supplied from the battery BT in response to turning on of the ignition switch 17, so that the microcomputer 8 starts its operation from the initial condition. At this time, the count completion flag FC is set to "0" at step S100 in FIG. 3. Therefore, when the first erasure command is received from the memory rewrite device 14, it is determined that the count completion flag FC is "0" (S300: YES) at step S300 in one of the erasure and erasure count updating processing steps S220A–S220P. The count completion flag FC is set to "1" (S310), and the erasure count value CT stored in the block Q of the flash memory 22 is incremented by one (CT=CT+1). Further, the stored contents in the block identified by the erasure command received this time are erased (S330). On the contrary, when the second or subsequent erasure command is received from the memory rewrite device 14 after the microcomputer 8 started its operation, the count completion flag FC has been already set to "1". Therefore, it is determined at step S300 in one of the erasure and erasure count updating processing steps S220A–S220P that the count completion flag FC is "1" (S300: NO). Thus, the storage contents in the block identified by the erasure command received this time are erased without incrementing the erasure count value CT.

Figure 5:
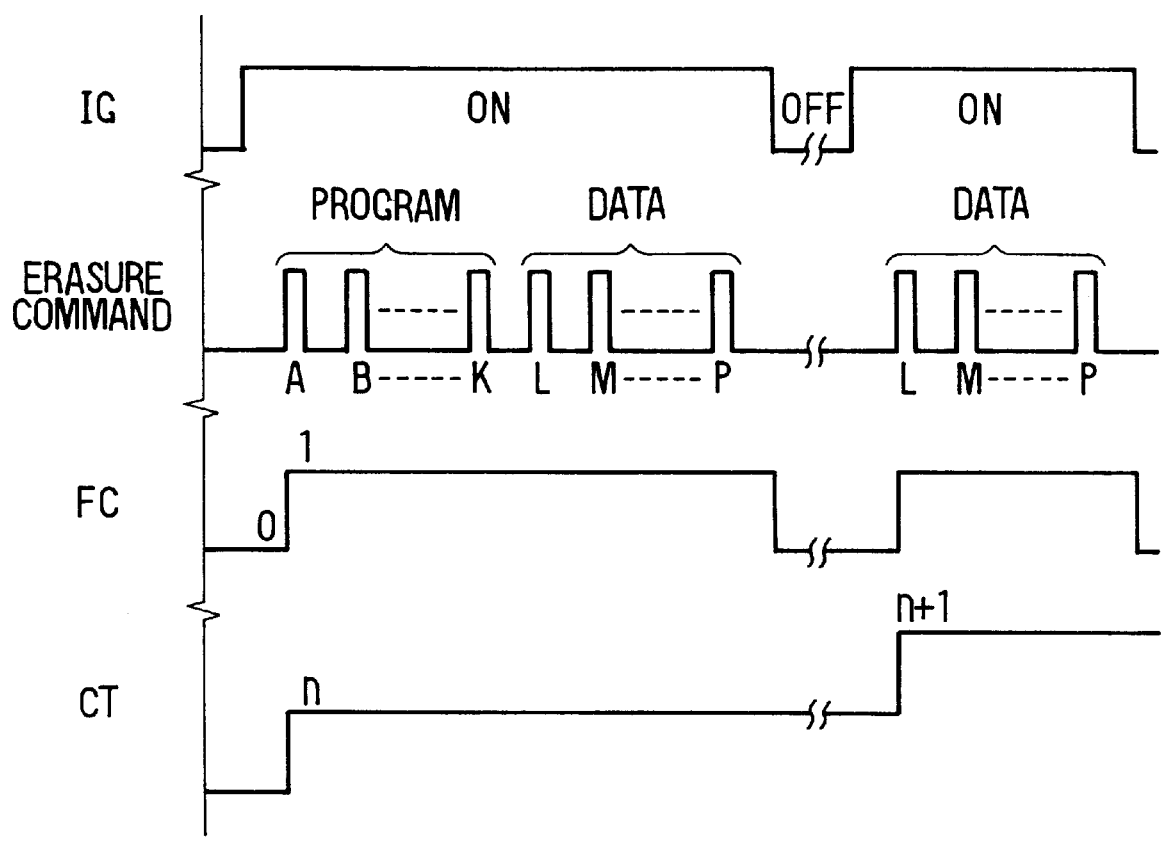
FIG. 5 s timing diagram showing operation of the ECU in the embodiment.

For instance, as shown in FIG. 5, even when a plurality of erasure commands are received from the memory rewrite device 14 sequentially to rewrite the storage contents (i.e., all of control program and control data) in the blocks A–P of the flash memory 22 during one period in which the ignition switch (IG) 17 is held turned on, the erasure count value CT is counted up by one and updated to "n" only when the storage contents in the first block (e.g., block A) is erased in response to the first erasure command for one block (block A). Thus, even when the storage contents in other blocks (B–P) are erased sequentially in response to the erasure commands for the other blocks, the erasure count value CT is not updated and is held at CT=n.

Further, even when a plurality of erasure commands are received from the memory rewrite device 14 to rewrite the storage contents (e.g., only control data) in the blocks (e.g., blocks L–P) of the flash memory 22 during the period in which the ignition switch 17 is held turned on again after the ignition switch 17 is turned off once, the erasure count value CT is counted up by one and updated to "n+1" when the storage contents in the first block (e.g., block L) is erased in response to the first erasure command for one block (block L). Thus, even when the storage contents in other blocks (M–P) are erased sequentially in response to the erasure commands for the other blocks, the erasure count value CT is not updated and is held at CT=n+1.

Thus, the number of erasure processing for each block of the flash memory 22 is counted as the number of rewrite of the flash memory 22, and the erasure count value is not counted up or updated even when the rewrite processing is carried out for a plurality of blocks of the flash memory 22 as long as the ECU 2 is held operative continuously after its initial condition, that is, as long as the electric power is supplied continuously to the ECU 2. As a result, the number of rewrite of the flash memory can be updated efficiently and with sufficient accuracy.

That is, even when all of the control programs and the control data (i.e., all storage contents in the blocks A–P) in the flash memory 22 are rewritten, the number of erasure of all the contents is counted as one. Thus, the actual number of rewrite of the flash memory 22 and the erasure count value does not differ from each other.

Further, as shown in FIG. 5, when only the control data are rewritten after all of the control programs and the control data have been rewritten, the erasure processing is carried out for each of the blocks L–P storing the control data. This is also counted as one erasure or rewrite. In this instance, the actual maximum number of rewrite of each block (i.e., the maximum number of rewrite of the blocks L–P storing the control data) equals the erasure count value.

Still further, when only one of the control programs and the control data in the flash memory is rewritten, the erasure processing is carried out only with respect to the blocks storing the contents to be rewritten. This is also counted as one erasure or rewrite. Even if this kind of rewrite occurs plural times, the erasure count value CT indicative of the number of erasure processing becomes larger than the actual maximum number of rewrite of each block in the flash memory 22. Thus, rewrite operation is restricted from being carried out in excess of the allowable number of guaranteed rewrite of the flash memory 22.

As described above, according to the present preferred embodiment, the erasure count value CT becomes closer to the actual maximum number of the rewrite of each block in comparison with the case in which each erasure operation is counted simply. Thus, the number of rewrite the flash memory 22 can be counted more accurately.

In addition, the number of execution of the erasure processing is counted without distinguishing each block A–P. Thus, it is very efficient in that the storage region for storing the erasure count value CT in the flash memory 22 can be reduced to a minimum, that is, only to one block Q.

Further, the erasure count value CT is counted up or updated only in response to the first erasure command after starting operation from the initial condition. Thus, the number of the erasure processing having been carried out can be maintained, even when the rewrite operation for the flash memory 22 is interrupted before its completion for some reason.

Still further, it is checked at step S170 in FIG. 3 whether the erasure count value CT stored in the block Q of the flash memory 22 has reached the predetermined reference value Cr before starting the program rewrite processing for executing the storage contents in the flash memory 22, and the report signal indicative of the check result is transmitted to the memory rewrite device 114 (S180) if the count value CT has reached the reference value Cr (S170: YES). Thus, the rewrite of the flash memory 22 can be restricted easily and simply from being executed in excess of the number of guaranteed rewrite operation.

In the above preferred embodiment, the rewrite program for carrying out the processing at steps S170–S190 shown in FIG. 3 and the processing shown in FIG. 4 is loaded from the memory rewrite device 14 into the RAM 24 in the ECU 2, there may be provided such a modified arrangement that the rewrite program is prestored in the masked ROM 24 and carried out thereby. In this modified arrangement, the processing at steps S150 and S160 shown in FIG. 3 can be omitted.

The above preferred embodiment may be so modified that bit data is written in additive manner into the block Q of the flash memory 22 at step S320 in the erasure and erasure count value updating processing shown in FIG. 4, so that the number of execution of the erasure processing can be recognized by counting the number of bits written into the block Q.

Further, the above preferred embodiment may be so modified that, when it is determined negatively at step S230P in FIG. 4 (S230P: NO), the processing jumps to the reset start address of the program by software in response to a completion command from the memory rewrite device 14 to start the processing from step S100 in FIG. 3. That is, in this instance, the ECU 2 automatically starts its operation from the initial condition in response to the completion command from the memory rewrite device 14.

Further, although the ECU in the above preferred embodiment is designed for controlling a vehicle engine, it will be obvious to those skilled in the art that the present invention is also applicable to other electronic control devices for controlling such mechanisms as a brake, transmission and suspension in the same manner as set forth hereinabove.

The present invention may be embodied in other specific forms without departing from the spirit or essential characteristics thereof.

What is claimed is:

1. An electronic control unit comprising:

an electrically erasable and rewritable nonvolatile read-only memory capable of erasing storage contents thereof block by block , and storing a control program and control data for a predetermined control object to be controlled;

processing means for regulating the control object in normal operation according to the control program and the control data stored in the nonvolatile memory, and carrying out an erasure processing to erase a storage content in each of the blocks identified by an erasure command received from an external device when a predetermined rewrite condition is met and to replace the erased storage content with a new content received from the external device; and counting means for counting the number of execution of the erasure processing as the number of rewrite of the nonvolatile memory and storing the counted number in a nonvolatile storage region, wherein the counting means counts the number of execution of the erasure processing only once even when the erasure processing is executed repeatedly for a plurality of the blocks during a period in which the processing means is held operative from an initial condition thereof.

2. An electronic control unit as claimed in claim 1, wherein the counting means is rendered operative to count the number only when the processing means carries out the erasure processing for the first time from the initial condition.

3. An electronic control unit as claimed in claim 2, wherein the counting means is rendered operative to count the number only when the processing means receives the erasure command for the first time from the initial condition.

4. An electronic control unit as claimed in claim 1, further comprising:

reporting means for checking whether the counted number has reached a predetermined reference value and reporting externally when the counted number has reached the reference value.

5. A method for counting the number of rewrite of an electrically erasable and rewritable nonvolatile read-only memory capable of erasing storage contents thereof block by block by an erasure processing of processing means to erase a storage content in each of the blocks identified by an erasure command received from an external device when a predetermined rewrite condition is met and to replace the erased storage content with a new content received from the external device, the method comprising the step of:

counting the number of execution of the erasure processing as the number of rewrite of the nonvolatile memory and limit the count to one during a period in which the processing means is held operative from an initial condition thereof, even when the erasure processing is executed repeatedly for a plurality of the blocks of the nonvolatile memory.

6. A method as claimed in claim 5, further comprising the step of:

comparing the counted number with a reference value to enable a rewrite of the nonvolatile memory only when the counted number is less than the reference value.

* * * * *